United States Patent [19]
Homma et al.

[11] Patent Number: 5,777,300
[45] Date of Patent: Jul. 7, 1998

[54] PROCESSING FURNACE FOR OXIDIZING OBJECTS

[75] Inventors: Kenji Homma, Sagamihara; Koichi Yomiya, Tama, both of Japan

[73] Assignees: Tokyo Electron Kabushiki Kaisha, Tokyo; Tokyo Electron Tohoku Kabushiki Kaisha, Iwate-ken, both of Japan

[21] Appl. No.: 341,052

[22] Filed: Nov. 16, 1994

[30] Foreign Application Priority Data

| Nov. 19, 1993 | [JP] | Japan | 5-314356 |
| Nov. 19, 1993 | [JP] | Japan | 5-314357 |
| Nov. 24, 1993 | [JP] | Japan | 5-317407 |
| Jan. 28, 1994 | [JP] | Japan | 6-026084 |

[51] Int. Cl.$^6$ ............................ H05B 6/80; H01L 21/31
[52] U.S. Cl. .................. 219/679; 219/687; 219/686; 118/715; 427/255.3; 437/248
[58] Field of Search ........................ 219/687, 688, 219/679, 686; 118/719, 715, 724, 725; 437/247, 248; 427/248.1, 255.3

[56] References Cited

U.S. PATENT DOCUMENTS

| 3,306,768 | 2/1967 | Peterson. | |
| 4,275,094 | 6/1981 | Takagi et al. | 118/733 |
| 4,315,479 | 2/1982 | Tole et al. | 118/726 |
| 4,436,674 | 3/1984 | McMenamin | 73/861.04 |
| 5,081,069 | 1/1992 | Parker et al. | 437/235 |
| 5,234,501 | 8/1993 | Nakao et al. | 118/719 |
| 5,312,509 | 5/1994 | Eschbach | 118/719 |
| 5,478,400 | 12/1995 | Shimizu | 118/733 |

FOREIGN PATENT DOCUMENTS

| 63-210501 | 9/1988 | Japan. |
| 63-60528 | 11/1988 | Japan. |

Primary Examiner—Philip H. Leung
Attorney, Agent, or Firm—Beveridge, DeGrandi, Weilacher & Young, L.L.P.

[57] ABSTRACT

The present invention comprises a processing furnace for oxidizing object to be processed at a high temperature, pressure reducing means for evacuating the interior of the processing furnace, a burning apparatus disposed outside the processing furnace for burning hydrogen gas and oxygen gas to generate water vapor, a water vapor supply pipe interconnecting the burning apparatus and to the processing furnace, and a throttle disposed on the water vapor supply pipe for generating a pressure difference in the water vapor supply pipe between a side of the burning apparatus and a side of the processing furnace. Stable burning is ensured in the burning apparatus, which makes set oxidation under low pressures possible. It is possible that in place of the throttle, atomization means for atomizing pure water, or a boiling water vapor generating unit, or a microwave water vapor generating unit.

12 Claims, 10 Drawing Sheets

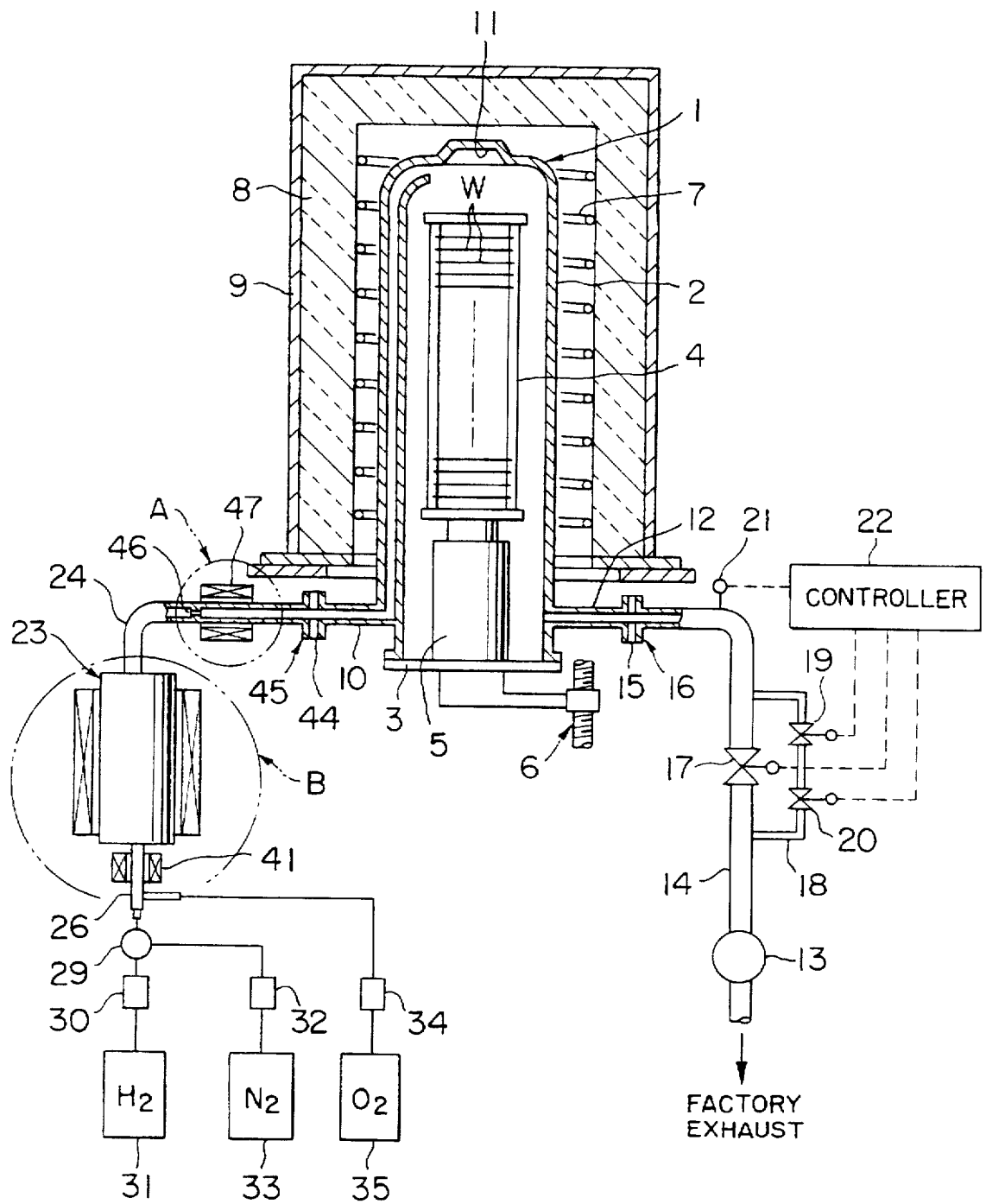
F I G. 1

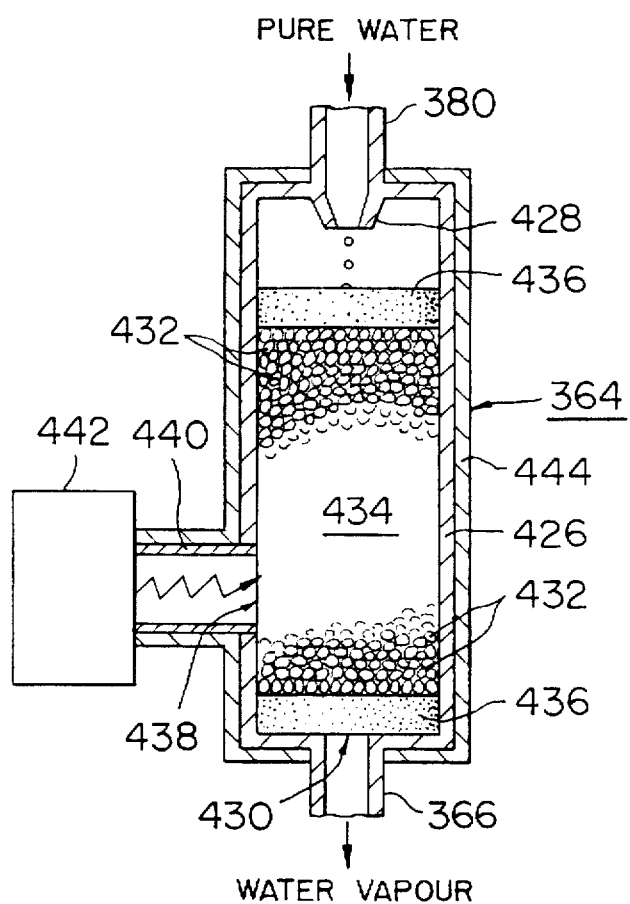
F I G. 14
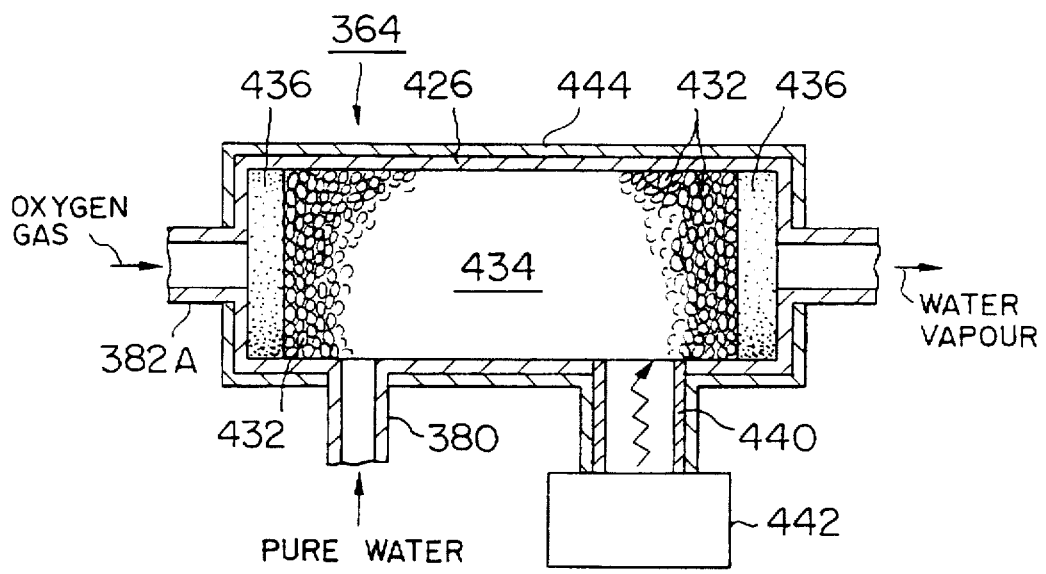
F I G. 15

PRIOR ART
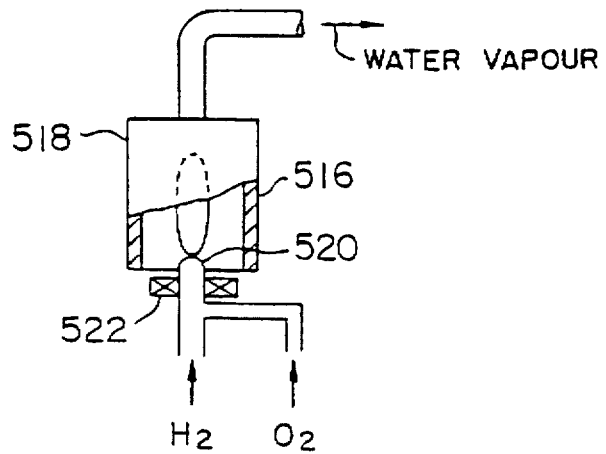
F I G. 17

PROCESSING FURNACE FOR OXIDIZING OBJECTS

BACKGROUND OF THE INVENTION

The present invention relates to an oxidation system and oxidation method which makes oxidation under low temperatures possible.

The fabrication of the conventional semiconductor devices, for example, includes an oxidation step of forming an oxide film on the surface of a semiconductor wafer. One method for the oxidation is a method by which a semiconductor wafer is oxidized in contact with water vapor at a high temperature (wet oxidation). A method for this type of oxidation is described in, e.g., Japanese Patent Publication No. 60528/1988 and Japanese Patent Laid-Open Publication No. 210501/1988 in which a (external) burning apparatus for reacting (burning) hydrogen gas and oxygen gas with each other to generate water vapor is independently provided outside a processing furnace to feed the water vapor generated by the burning apparatus to the processing furnace through a water vapor feed pipe.

This conventional oxidation method will be explained with reference to FIGS. 16 and 17.

FIG. 16 shows a block diagram of a conventional heat treatment apparatus for generating water vapor by boiling pure water by a heater. A water vapor feed pipe 506 is connected to a processing furnace 504, which is loaded with a wafer boat 502 having a number of semiconductor wafers W vertically spaced from each other mounted therein, and a water vapor generating furnace 510 with a heater inserted in the water vapor feed pipe 506.

The water vapor generating furnace 510 having the wall of, e.g., quartz which is supplied with pure water from a pure water source 512, and oxygen gas as a carrier gas from an oxygen source 514, heats and boils the pure water therein to generate water vapor. The generated water vapor is introduced into the processing furnace 504 to oxidize the surfaces of the wafers at a high temperature and under the normal pressure or at a high temperature and under a high pressure.

FIG. 17 shows a diagrammatic view of the conventional water vapor feed pipe for generating water vapor by burning hydrogen gas and oxygen gas. A burning furnace 518 having the inside wall 516 of, e.g., quartz, which has good heat resistance and corrosion resistance is inserted in the water vapor feed pipe 516, and a burning nozzle 520 also of quartz is provided inside the furnace 518. An ignition heater 522 for heating the gases up to their ignition points is provided around the nozzle 520.

Required amounts of oxygen gas and hydrogen gas are fed through this nozzle into the burning furnace to generate water vapor, and the generated water vapor is introduced into the processing furnace to oxidize the surfaces of the wafers at a high temperature and under the normal pressure or at a high temperature and under a high pressure.

A problem with such oxidation system is how to improve film quality of the oxidized films. Water vapor generating conditions for the water vapor generating furnace, burning conditions of the burning furnace, temperature conditions of the processing furnace, etc. are selected to improve the film quality. But the structures of the conventional water vapor generating furnace and the burning furnace adversely limit selection conditions, which has substantially set a limit to improvement of the film quality. Success of low-pressure chemical vapor deposition (CVD) in improving film quality by film processing under a low pressure has been noted, and it has been proposed to conduct the above-described oxidation under a low pressure.

But the method using the system of FIG. 16, in which pure water is boiled to generate water vapor, adversely permits microorganisms, such as bacteria, viruses, etc. propagating in a pure water source 512 for reserving pure water to be introduced together with the generated water vapor into the processing furnace 504, and the microorganisms stick to the surfaces of the wafers which cause defective wafers.

In addition, when the heater 508 of the water vapor generating furnace 510 is heated up to above about 200° C., a metal material of the heater 508 is much activated, and the activated metal passes, although a trace of it, the quartz of the water vapor generating furnace wall into the furnace and into the pure water and the generated water vapor, and is carried into the processing furnace 504 and causes metal contamination to the wafers W. This has been also problem.

In the method using the water vapor feed pipe of FIG. 17, in which hydrogen gas and oxygen gas are burnt to generate water vapor, oxidation in the processing furnace under low pressures makes burning in the burning furnace 518 unstable, which not only makes stable feed of water vapor difficult, but also increases a risk of explosion due to the hydrogen gas. Thus it has been difficult to realize wet oxidation under low pressures.

Furthermore, the quartz of the inside wall 516 of the burning furnace 518, and the nozzle 520 is devitrified by burning of the hydrogen and oxygen, and due to a long time of use the devitrified quartz peels off, and scatters in particles and sticks to the surfaces of wafers being processed. This has been also a problem.

SUMMARY OF THE INVENTION

In view of these problems the present invention was made, and an object of the present invention is to provide an oxidation system and an oxidation method which has realized wet oxidation under low pressures.

To achieve the above-described object, the oxidation system according to a first embodiment of the present invention comprises a processing furnace for oxidizing the object to be processed at a high temperature, pressure reducing means for evacuating the interior of the processing furnace, a burning apparatus disposed outside the processing furnace for burning hydrogen gas and oxygen gas to generate water vapor, a water vapor supply pipe interconnecting the burning apparatus and to the processing furnace, and a restricted part disposed on the water vapor supply pipe for generating a pressure difference in the water vapor supply pipe between a side of the burning apparatus and a side of the processing furnace.

According to the first embodiment of the present invention, because the restricted part is provided on the water vapor supply pipe interconnecting the burning apparatus and the processing furnace for generating a pressure difference in the water vapor supply pipe between the sides of the burning apparatus and the processing furnace, pressure reduction in the reaction furnace removes or decreases affection of the pressure reduction to the burning apparatus, so that burning in the burning apparatus can be stable. Accordingly supply of water vapor can be more stable and safe, whereby wet oxidation under low pressures is enabled, and film quality of the oxide films are improved.

To achieve the above-described object, the oxidation system according to a second embodiment of the present invention comprises a processing furnace for oxidizing the object to be processed at a high temperature, pressure reducing means for evacuating the interior of the processing furnace, atomization means for atomizing pure water fed from a pure water source, and water vapor supply pipe for heating the atomized pure water into water vapor, supplying the water vapor into the reaction furnace.

According to the second embodiment of the present invention, because the processing furnace for oxidizing the object to be processed is evacuated by pressure reduction means, and atomized pure water by the atomization means is supplied into the processing furnace, being heated into water vapor through the pure water supply pipe, wet oxidation is enabled without a burning apparatus under low pressures. Safety can be improved, and film quality of the oxide films can be improved.

To achieve the above-described object, the oxidation system according to a third embodiment of the present invention comprises a processing furnace for oxidizing the objects to be processed at a high temperature, evacuating means for evacuating the interior of the processing furnace, a boiling pure water vapor generating unit for boiling pure water supplied from a pure water source to generate water vapor, and a water vapor supply pipe for supplying water vapor generated by the boiling water vapor generating unit to the processing furnace.

According to the third embodiment, because the interior of the processing furnace for oxidizing objects to be processed at a high temperature is evacuated by the pressure reduction means, and water vapor generated by the boiling water vapor generating unit is fed into the processing furnace through the water vapor supply pipe, wet oxidation is enabled under low pressures without the use of a burning apparatus, so that safety can be improved, and film quality of the oxide films can be improved To achieve the above-described object, the oxidation system according to a fourth embodiment of the present invention comprises a processing furnace for oxidizing objects to be processed at a high temperature, evacuation means for evacuating the interior of the processing furnace, a microwave water vapor generating unit for heating pure water by microwaves to generate water vapor, a pure water reservoir for reserving pure water to be supplied to the water vapor generating unit, and a water vapor supply pipe for supplying water vapor generated by the water vapor generating unit to the processing furnace.

According to the fourth embodiment, the pure water in the pure water reservoir is supplied to the microwave water vapor generating unit to be heated and boiled by microwaves into water vapor. The generated water vapor is fed into the processing furnace whose interior has been evacuated by the pressure reduction means through the water vapor supply pipe, and there contacts with the heated surfaces of the objects to be processed and oxidizes them. Thus, without the use of a water vapor generating unit with a burning furnace and heaters, water vapor can be generated to conduct oxidation under low pressures. Oxide films of higher quality can be formed.

BRIEF DESCRIPTION OF THE DRAWINGS

FIG. 1 is a vertical sectional view of the oxidation system according to a first embodiment of the present invention.

FIG. 14 is an enlarged vertical sectional view of the microwave water vapor generating unit of the oxidation system of FIG. 14.

FIG. 15 is an enlarged vertical sectional view of a variation of the microwave water vapor generating unit of FIG. 14.

FIG. 17 is a block diagram of a conventional water vapor generating unit for burning hydrogen gas and an oxidation gas to generate water vapor.

DETAILED DESCRIPTION OF PREFERRED EMBODIMENTS

[First Embodiment]

Figure 2:
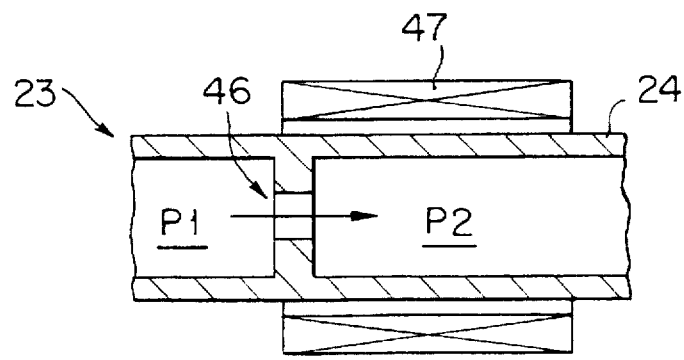
FIG. 2 is an enlarged vertical sectional view of the restricted part (indicated by the arrow A) of the oxidation system of FIG. 1.

A first embodiment of the present invention will be explained with reference to drawings attached hereto.

In FIG. 1 showing the general structure of the oxidation system according to the first embodiment of the present invention, reference numeral 1 represents a vertical processing furnace for oxidizing objects to be processed, semiconductor wafers W at a high temperature, e.g., about 850° C. The processing furnace 1 includes a heat resistant reaction tube 2 of, e.g., quartz in the shape of a vertical cylinder having the bottom opened. The reaction tube 2 is closed at the bottom opening by a cap 3 to be a highly air-tight vessel. The cap 3 for closing and opening the bottom opening is disposed below the reaction tube 2. On the cap 3 there is provided upright a wafer boat 4 through a heat insulating cylinder 5. The wafer boat 4 holds a number (e.g., about 150 sheets) of semiconductor wafers W horizontal 14 and vertically spaced from each other.

The cap 3 is connected to a lift mechanism 6 which loads and unloads the wafer boat 4 into and out of the reaction tube 2 while moving the cap 3 up and down to open and close the bottom opening. A heater 7 is provided around the reaction tube 2, and heats the interior of the reaction tube 2 up to a required temperature, e.g., 800°–1000° C. An outer shelter of stainless steel 9 is provided around the outside of the reaction tube 2 through heat insulating material 8.

A water vapor feed pipe 10 is provided in a side (a lower part of a side) of the reaction tube 2 in one-piece with the reaction tube 2, and is integrally connected to a wall of the reaction tube 2 at a proximal part thereof and is extended upward and is integral with a tubular wall of the reaction tube 2 to be opened in a water vapor feed port 11 formed in a concavity on the upper end of the inside of the reaction tube 2. An exhaust pipe 12 is provided in a different side (a lower part of a side) of the reaction tube 2 and is air-tightly connected to a pressure reduction pipe 14 having a pressure reduction pump 13 as pressure reduction means by flange couplings 16 with a double O-ring 15 therebetween.

An opening/closing valve 17 in the form of, e.g., an angle valve is inserted in the pressure reduction pipe 14, and a bypass pipe 18 is connected to the pressure reduction pipe 14. An opening/closing valve 19 in the form of, e.g., an air operate valve, and a pressure control valve 20 in the form of, e.g., piezo-valve are inserted in the bypass pipe 18. When the interior of the reaction tube 2 is evacuated to, e.g., about 300–500 Torr, the controller 22 controls various instruments in accordance with pressures detected by the pressure sensor 21 to open the opening/closing valve 17 of the pressure reduction pipe 14 so as to reduce a pressure down to a required pressure, and then close the opening/closing valve 17 of the pressure reduction pipe 14 while opening the opening/closing valve 19 of the bypass pipe 18 so as to maintain the required pressure by the pressure control valve 20. The downstream of the pressure reduction pipe 14 is connected to a factory exhaust duct not shown.

Figure 3:
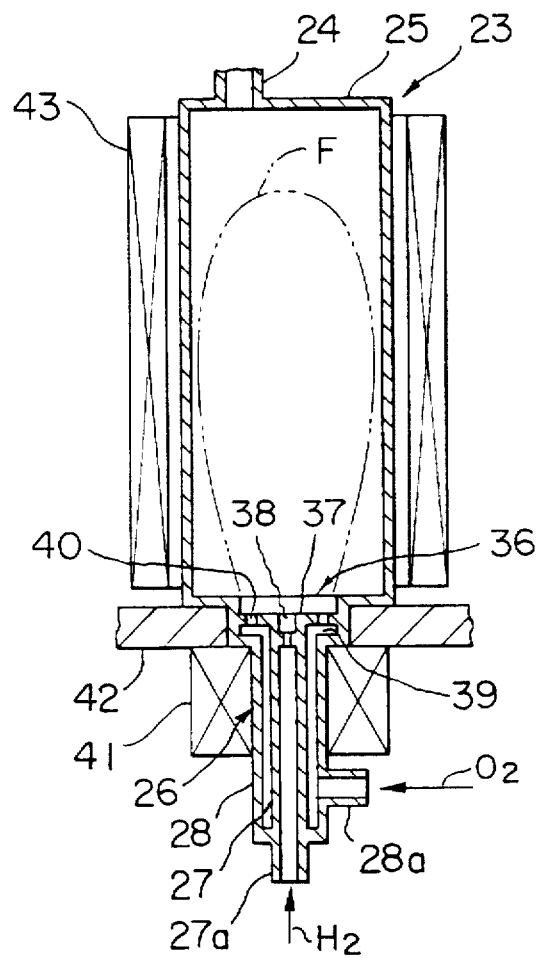
FIG. 3 is an enlarged vertical sectional view of the burning apparatus (indicated by the arrow B) of the oxidation system of FIG. 1.

The water vapor feed pipe 10 of the reaction tube 2 is connected, through a water vapor supply pipe 24, to a burning (reaction) means 23 for burning (reacting) hydrogen gas and oxygen gas to generate water vapor. As shown in FIG. 3, the burning means 23 comprises a vertically cylindrical burning vessel 25 of, e.g., quartz, which is heat resistant. A gas feed pipe 26 of quartz is extended downward from the bottom of the burning vessel 25 in one-piece therewith. The gas feed pipe 26 has a double-pipe structure, and includes a hydrogen gas feed pipe 27 at the center and an oxygen gas feed pipe 28 surrounding the hydrogen gas feed pipe 27 outside. The hydrogen gas feed pipe 27 has a connection port 27a extended downward through the closed bottom of the oxygen gas feed pipe 28, and the oxygen gas feed pipe 28 outside around the hydrogen feed pipe 27 has a connection port 28a extended outward from a lower side thereof.

As shown in FIG. 1, the connection port 27a of the hydrogen gas feed pipe 27 is connected to a hydrogen gas source 31 through a change-over valve 29 and a flow rate control mechanism 30 and is also connected to a nitrogen gas source 33 through a pipe branched at the change-over valve 29 and a flow rate control mechanism. The connection port 28a of the oxygen gas feed pipe 28 is connected to an oxygen gas source 35 through a flow rate control mechanism 34.

As shown in FIG. 3, a circular cross-sectional concavity 36 is formed in the center of the bottom of the burning vessel 25 in one-piece therewith. The upper end of the oxygen gas feed pipe 28 is communicated with the cavity at the bottom thereof. A quartz annular diffusion plate of a suitable width is formed on the substantial depth-wise middle of the concavity in one-piece therewith in such a manner as a partition wall. The upper end of the hydrogen gas feed pipe 27 is connected to the inner circumferential edge of the diffusion plate 37.

As shown in FIG. 3, a hydrogen gas injection nozzle 38 having a reduced bore, which is also for oxygen gas reverse flow prevention is formed a little lower than the diffusion plate 37 in one-piece with the hydrogen gas feed pipe 27. The oxygen gas feed pipe 28 is in communication with an annular space 39 of the concavity 36 below the diffusion plate 37. The diffusion plate 37 has a plurality of small-diameter oxygen gas injection nozzles 40 bored widely distributed so that the oxygen gas is divergently injected from the annular space 39 into the burning vessel 25.

A gas heating heater 41 is provided around the double-pipe structure gas feed pipe 26. The gas heating heater 41 heats the hydrogen gas and the oxygen gas introduced in the hydrogen gas feed pipe 27 and the oxygen gas feed pipe 28 to above their spontaneous ignition points, so that the heated hydrogen gas and the heated oxygen gas are injected from the hydrogen gas injection nozzle 38 and the oxygen gas injection nozzle 40 into the burning vessel 25 and mixed there to burn in flames F. This burning generates water vapor. A heat insulating material 42 is provided between the gas heating heater 41 and the bottom of the burning vessel 25, and a cooling mechanism 43 in the form of, e.g., a water cooling jacket for cooling the heat insulating material 42 down to, e.g., 500° C. is provided around the burning vessel 25. A water vapor supply pipe 24 of quartz is extended from the top of the burning vessel 25 in one-piece therewith. As shown in FIG. 1, the water vapor supply pipe 24 is connected air-tight to the water vapor feed pipe 10 of the reaction vessel 2 by flange couplings 45 with a double O-ring 44 therebetween.

As shown in FIG. 2, a restricted part, e.g., quartz orifice 46 is formed in the water vapor supply pipe 24 in one-piece therewith for generating a pressure difference (P1–P2) between the sides of the burning apparatus 23 and of the processing furnace 1. Depending on a size and thickness of the bore of the orifice 46 with respect to those of the inner diameter of the water vapor supply pipe 24, a pressure P2 on the side of the processing furnace 1 is, e.g., about 600 Torr with respect to a pressure P1 of, e.g., 300–500 Torr on the side of burning apparatus 23. As shown in FIG. 1, a water vapor heating heater 47 which is a heating unit for heating the water vapor which has just passed the orifice 46 up to about 200° C. is provided around the water vapor supply pipe 24 so that dewing of the water vapor due to a pressure change (adiabatic expansion) caused by passing through the orifice 46 is prevented.

Then, the operation of the oxidation system of the above-described structure according to the first embodiment will be explained. First, nitrogen gas is fed into the reaction tube 2 of the processing furnace 1 from the nitrogen gas source 33 through the burning vessel 25 and the water vapor supply pipe 24 while the interior of the reaction tube 2 is evacuated by the pressure reduction pipe and the pressure reduction pump 13, whereby the interior of the reaction tube 2 is replaced by the nitrogen gas. Subsequently the cap 3 is opened to load the wafer boat 4, on which with semiconductor wafers W are mounted on into the reaction tube 2 together with the heat insulating cylinder 5. Then with the nitrogen gas fed, the controller 22 controls to evacuate the interior of the reaction tube 2 to a required pressure, e.g., 400 Torr, and next with this pressure retained, the nitrogen gas source 33 is gradually switched to the oxygen gas source 35 to replace the nitrogen gas in the reaction tube 2 with the oxygen gas.

Then, with the pressure retained, hydrogen gas is fed from the hydrogen gas source 31 so that a flow rate ratio of the hydrogen gas to that of the oxygen gas is, e.g., 1 to. 1. The hydrogen gas and the oxygen gas are heated by the gas heating heater 41 up to, e.g., 850° C. to burn in the burning vessel 25, whereby water vapor is generated. This water vapor is fed into the reaction tube 2 retained under a required reduced pressure, e.g., 400 Torr and a required temperature, e.g., 850° C. so that required wet oxidation is conducted on the semiconductor wafers W. The hydrogen gas and the oxygen gas which have been introduced in the burning vessel 25 stoichiometrically burn in a ratio of 2 to. 1. Accordingly the oxygen gas is a little oversupplied, but the surplus oxygen gas functions as a carrier gas for the water vapor and contributes to oxidation in the reaction vessel 2.

In wet oxidizing objects to be processed in a reduced pressure, the reduced pressure acts in the burning apparatus 23 from the reaction tube 2 with the reduced pressure established through the water vapor supply pipe 24, whereby stable burning in the burning apparatus 23 might be hindered. In the first embodiment of the present invention, the orifice 46 is inserted in the water vapor supply pipe 24 connecting the burning apparatus 23 to the reaction tube 2 of the processing furnace 1 for generating a pressure difference between the sides of the burning apparatus 23 and of the processing furnace 1 which shut off at a reduced pressure which directly acts in the burning apparatus 23, so that stable burning in the burning apparatus 23 is secured. As a result, a stable supply of water vapor, and improved security are ensured, which makes possible oxidation under a reduced pressure and improves film quality of the oxide films.

That is, this oxidation method includes the steps of reacting hydrogen gas and oxygen gas with each other to generate water vapor, supplying the water vapor into the reaction tube 2 of the processing furnace 1 whose pressure has been reduced with the pressure reduction of the reaction tube 2 shut off so as not to directly act on the reaction between the hydrogen gas and the oxygen gas, and heating semiconductor wafers W, objects to be processed in the reaction tube of the processing furnace 1, while heating the same in contact with the water vapor to oxidize the semiconductor wafers W.

Thus, because the semiconductor wafers W, objects to be processed, are wet oxidized under a reduced pressure, the oxidation is carried out at a lower speed, which allows for control of a film thickness of an oxide film formed on the semiconductor wafer W, so that the film can have improved film quality and can be ultra-thin (e.g., about 50 Å). Because the water vapor which has been just passed through the orifice 46 is heated by the water vapor heating heater 47, dewing of the water vapor due to pressure changes can be prevented, which further improves quality of the film.

Furthermore, in the burning apparatus 23, the oxygen gas injection nozzles 40 are projected upwards of the forward end of the hydrogen gas injection nozzle 38, and are widely spaced around the same. As a result, the oxygen gas that is injected is dispersed over a large area around the hydrogen gas, so that flames F effectively burn radially thick and short in height. Thus, even if the pressure reduction should a have a little effect on the interior of the burning vessel 25 through the water vapor supply pipe 24, the flames F will not become thin, which would make the burning unstable.

After the oxidation is thus conducted, following the above-described procedure, inreverse order the feed of hydrogen gas is stopped, the interior of the processing furnace is replaced first by oxygen gas and next by nitrogen gas, the pressure reducing pump 13 is stopped to return the internal pressure of the reaction tube 2 to the normal pressure, and the processed semiconductor wafers W are unloaded out of the reaction tube 2 by the lift mechanism 6 together with the wafer boat 4 and the heat insulating cylinder 5.

Figure 4:
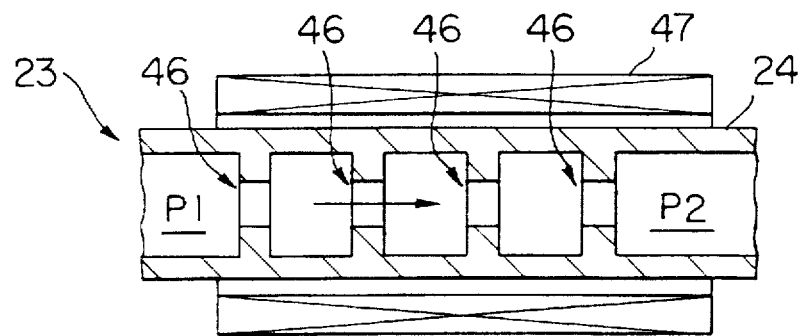
FIG. 4 is an enlarged vertical sectional view of a variation of the restricted part of FIG. 2.

FIG. 4 shows a variation of the restricted part of the water vapor supply pipe 24. In the water vapor supply pipe 24 there are provided in one-piece therewith orifices 46 of quartz longitudinally spaced from each other on multi-stages (4 stages in FIG. 4). A water vapor heating heater 47 is provided around the water vapor supply pipe 24 in such a manner as to cover all the orifices 46. Depending on a size of the bores and a thickness of the orifices 46 with respect to an inner diameter of the water vapor supply pipe 24, and a distance between each of the orifices 46 and its adjacent one, it is possible that a large pressure difference (P1–P2) can be generated without abrupt pressure changes so that the side of the burning apparatus 23 has a pressure P1 which is near the normal pressure, and the side of the processing furnace 1 has a sufficiently low pressure. As a result, more stable burning, and further improved film quality can be obtained.

Figure 5:
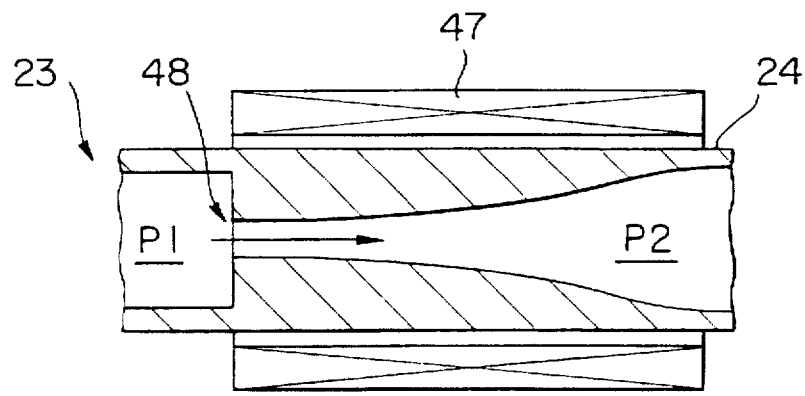
FIG. 5 is an enlarged vertical sectional view of another variation of the restricted part of FIG. 2.

FIG. 5 shows another variation of the restricted part of the water vapor supply pipe 24. A divergent nozzle 48 is formed in the water vapor supply pipe 24 in one-piece therewith. The water vapor heating heater 47 is provided around the convergent nozzle 48 in such a manner as to cover the entire convergent nozzle 48. Depending on a size of the bore and a length of the orifice 48 with respect to an inner diameter of the water vapor supply pipe 24, and distances, it is possible that similarly with the multi-stage orifices, a large pressure difference (P1–P2) can be generated without abrupt pressure changes so that the side of the burning apparatus 23 has a pressure P1 which is near the normal pressure, and the side of the processing furnace 1 has a sufficiently low pressure. As a result, more stable burning, and further improved film quality can be obtained.

The present invention is not limited to the first embodiment and covers modifications and variations within the scope of the present invention.

For example, the restricted parts of the first embodiment as shown in FIGS. 4 and 5 are the so-called pipe orifices and the so-called pipe nozzles. The restricted part may be formed around the water vapor supply pipe 24. That is, the water vapor supply pipe 24 may be a slender pipe, and in this case the pipe orifice and the pipe nozzle are not necessary.

In the first embodiment, the processing furnace 1 is a vertical furnace but may be a horizontal furnace. The objects to be processed are semiconductor wafers W but may be LCDs, etc. The oxidation system according to the first embodiment, which includes the high-temperature processing furnace 1 and the pressure reduction means (pressure reducing pump) 13, may be used as a low-pressure CVD device by connecting processing gas sources in place of the burning apparatus 23.

[Second Embodiment]

Figure 6:
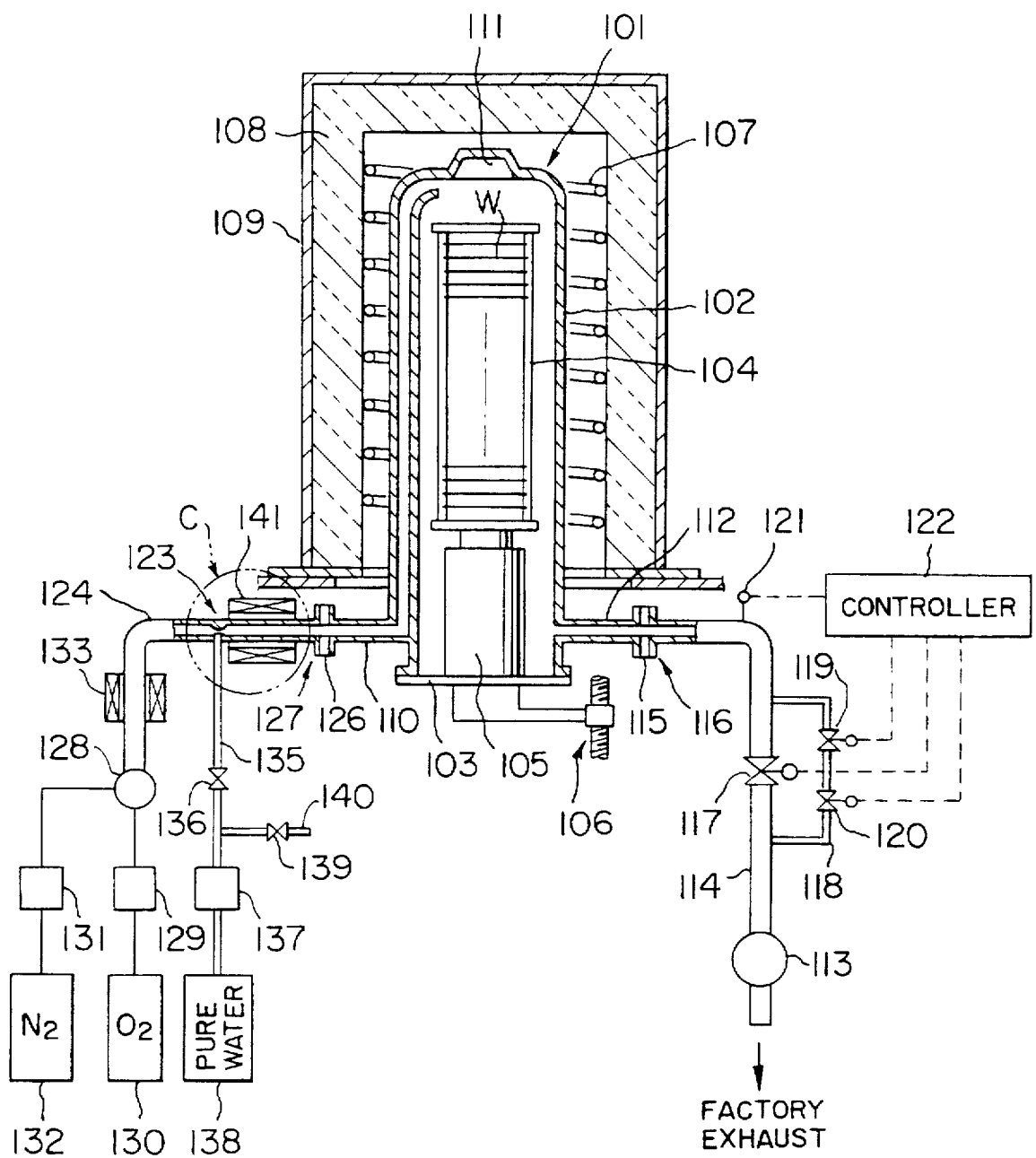
FIG. 6 is a vertical sectional view of the oxidation system according to a second embodiment of the present invention.

A second embodiment of the present invention will be explained with reference to drawings attached hereto. In FIG. 6 showing the general structure of the oxidation system according to the second embodiment of the present invention, similarly with the first embodiment, reference numeral 101 represents a vertical processing furnace for oxidizing objects to be processed, semiconductor wafers W at a high temperature, e.g., about 850° C. The processing furnace 101 includes a heat resistant reaction tube 102 of, e.g., quartz in the shape of a vertical cylinder having the bottom opened. The reaction tube 102 is closed at the bottom opening by a cap 103 to be a highly air-tight vessel. The cap 103 for closing and opening the bottom opening is disposed below the reaction tube 102. On the cap 103 there is provided upright a wafer boat 104 through a heat insulating cylinder 105. The wafer boat 104 holds a number (e.g., about 150 sheets) of semiconductor wafers W horizontal 14 supported and vertically spaced from each other.

The cap 103 is connected to a lift mechanism 106 which loads and unloads the wafer boat 104 into and out of the reaction tube 102 while moving the cap 103 up and down to open and close the bottom opening. A heater 107 is provided around the reaction tube 102, and heats the interior of the reaction tube 102 up to a required temperature, e.g., 800°–1000°C. An outer shelter of stainless steel 109 is provided around the outside of the reaction tube 102 through heat insulating material 108.

A water vapor feed pipe 110 is provided in a side (a lower part of a side) of the reaction tube 102 in one-piece with the reaction tube 102, and is integral with a wall of the reaction tube 102 at a proximal part thereof and is extended upward and is integral with a tubular wall of the reaction tube 102 to be opened in a water vapor feed port 110 formed in a concavity on the upper end of the inside of the reaction tube 102. An exhaust pipe 112 is provided in a different side (a lower part of a side) of the reaction tube 102 and is air-tightly connected to a pressure reduction pipe 114 having a pressure reduction pump 113 as pressure reduction means by flange couplings with a double O-ring therebetween.

An opening/closing valve 117 in the form of, e.g., an angle valve is inserted in the pressure reduction pipe 114, and a bypass pipe 118 is connected to the pressure reductionpipe 114. An opening/closing valve 119 in the form of, e.g., an air operate valve, and a pressure control valve 120 in the form of, e.g., piezo-valve are inserted in the bypass pipe 118. When the interior of the reaction tube 102 is evacuated to, e.g., about 300–500 Torr, the controller 122 controls various instruments in accordance with pressures detected by the pressure sensor 121 to open the opening/closing valve 117 of the pressure reduction pipe 114 so as to reduce a pressure down to a required pressure, and then close the opening/closing valve 117 of the pressure reduction pipe 114 while opening the opening/closing valve 119 of the bypass pipe 118 so as to maintain the required pressure by the pressure control valve 120. The downstream of the pressure reduction pipe 114 is connected to a factory exhaust duct not shown.

Figure 7:
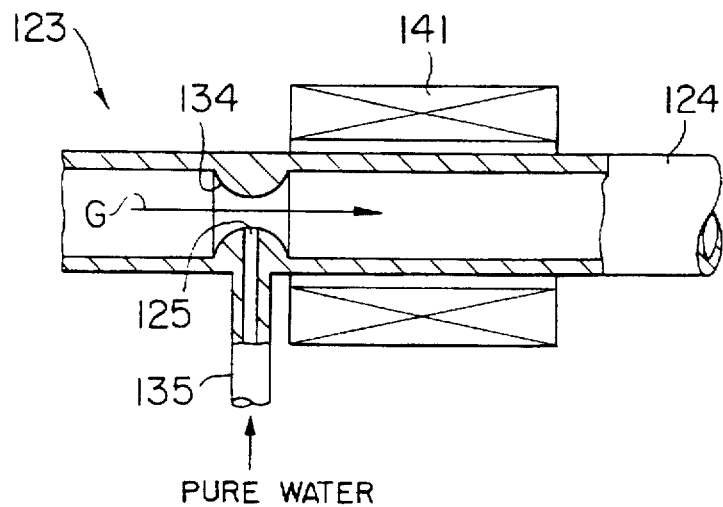
FIG. 7 is an enlarged vertical sectional view of the atomization means (indicated by the arrow C) of the oxidation system of FIG. 6.

In the second embodiment, for the supply of water vapor to the reaction tube 102 of the processing furnace 1, atomization means 123 for atomizing pure water, and a water vapor supply pipe 124 for supplying water vapor into the reaction tube 102, heating the atomized pure water. As shown in FIG. 7 showing an enlarged vertical sectional view of the part labelled "C" in FIG. 6, the atomization means 123 comprises the pure water feed nozzle 125 for feeding pure water into the water vapor supply pipe 124 and a throttle 134, whereby a carrier gas of oxygen gas or an inert gas is fed into the water vapor supply pipe 124 so that pure water to be supplied is atomized by gas flows to feed pure water into the processing furnace 101.

This structure is be detailed as follows. As shown in FIG. 6, the water vapor feed pipe 110 is connected air-tight to one end of the water vapor supply pipe 124 of quartz through flange couplings 127 with a double O-ring 126 therebetween. The other end (on the side of the entrance) of the water vapor supply pipe 124 is connected to an oxygen gas source 130 for supplying oxygen gas through a change-over valve 128 and a flow rate control mechanism 129, and is connected to a nitrogen gas source 132 for supplying nitrogen gas as an inert gas through a pipe branched from the water vapor supply pipe 124 by the change-over valve 128, and a flow rate control mechanism 131. A first heater 133 for heating a carrier gas G of oxygen gas or nitrogen gas up to a required temperature, e.g., about 200° C. is provided around a part of the water vapor supply pipe 124 on the side of the entrance.

As shown in FIG. 7, a throttle 134 for accelerating a flow rate of the carrier gas G is formed on an inside of the water vapor supply pipe 124 downstream of the first heater in one-piece therewith. The pure water feed nozzle 125 is formed through the throttle 134 in one-piece therewith. The proximal end of the pure water feed nozzle 125 is connected to a pure water feed pipe 135. As shown in FIG. 6, the pure water feed pipe 135 is connected to a pure water source 138 through an opening/closing valve 136 and a flow rate control mechanism 137. A drain pipe 140 is branched from the pure water feed pipe 135 between the opening/closing valve 136 and the flow rate control mechanism 137, and when pure water is not supplied to the pure water feed nozzle 125, the pure water is discharged through the drain pipe 140 to maintain a purity of the pure water. As shown in FIG. 7, a second heater 141 is provided around a part of the water vapor supply pipe 124 downstream of the pure water feed nozzle 125 to heat the same up to, e.g., about 200° C. for accelerating vaporization of pure water which is vaporized, atomized by gas flows of the heated carrier gas G and for supplying vaporization heat.

The operation of the oxidization system according to the second embodiment is explained as follows. First, as shown in FIG. 6, nitrogen gas is fed into the reaction tube 102 of the processing furnace 101 from the nitrogen gas source 132 through the water vapor supply pipe 124 while the interior of the reaction tube 102 is evacuated by the pressure reduction pipe 114 and the pressure reduction pump 113, whereby the interior of the reaction tube 102 is replaced by the nitrogen gas. Subsequently the cap 103 is opened to load the wafer boat 104 with semiconductor wafers W mounted into the reaction tube 102 together with the heat insulating cylinder 105. Then with the nitrogen gas fed, the controller 122 controls to evacuate the interior of the reaction tube 102 to a required pressure, e.g., 400 Torr, and next with this pressure retained, the nitrogen gas source 132 is switched to the oxygen gas source 130 to replace the nitrogen gas in the reaction tube 102 with the oxygen gas.

With the carrier gas G of oxygen gas being fed through the flow rate control mechanism 129, and the interior of the reaction tube 102 placed under the above-described pressure (400 Torr), pure water is fed from the pure water source 138 from the pure water source 138 into the water vapor supply pipe 124. The pure water injected from the pure water feed nozzle 125 is vaporized, being atomized by gas flow of the carrier gas G (hot gas) heated by the first heater 133 and accelerated at the throttle 134 of the water vapor supply pipe 124. The thus-generated water vapor is further heated by the second heater 141, so that part of atomized pure water is completely vaporized, and the pure water is heated up to a temperature (about 200° C.) which does not affect oxidation of the semiconductor wafers W in the reaction tube 102. The pure water is fed into the reaction tube 102 by the carrier gas G through the water vapor supply pipe 124 and contributes to oxidation of the semiconductor wafers W in the reaction tube 102. The oxygen gas as the carrier gas G also contributes to the oxidation. A feed amount of water vapor is controlled by the flow rate control mechanisms 129 and 137 of the oxygen source 130 and the pure water source 138 respectively.

In the second embodiment, the interior of the reaction tube 102 where semiconductor wafers W are oxidized at a high temperature is evacuated, and atomized pure water by the atomization means 123 is fed into the reaction tube 102 at the high temperature and under a reduced pressure, being heated into water vapor. Thus, without the use of the burning apparatus, semiconductor wafers W can be oxidized under a reduced pressure. Especially, in place of burning hydrogen gas and oxygen gas under a reduced pressure to generate water vapor, pure water is atomized and vaporized by gas flow of the carrier gas G to generate water vapor, whereby water vapor can be stably fed into the reaction tube 102, film quality of the oxide films can be improved, and security can be improved. Pure water is atomized on the so-called atomizer principle, whereby water vapor can be stably supplied by the simple structure, and equipment costs can be lowered.

After the oxidation is thus completed, supply of the water vapor is stopped, the interior of the reaction tube 102 is gradually replaced by oxygen gas and nitrogen gas. Then the evacuation pump 113 is stopped to return the interior of the reaction tube 102 to the normal pressure. Next, the wafer boat with the processed semiconductor wafers W mounted on is unloaded together with the heat insulating cylinder 105 downward out of the reaction tube by the lift mechanism 106.

Figure 8:
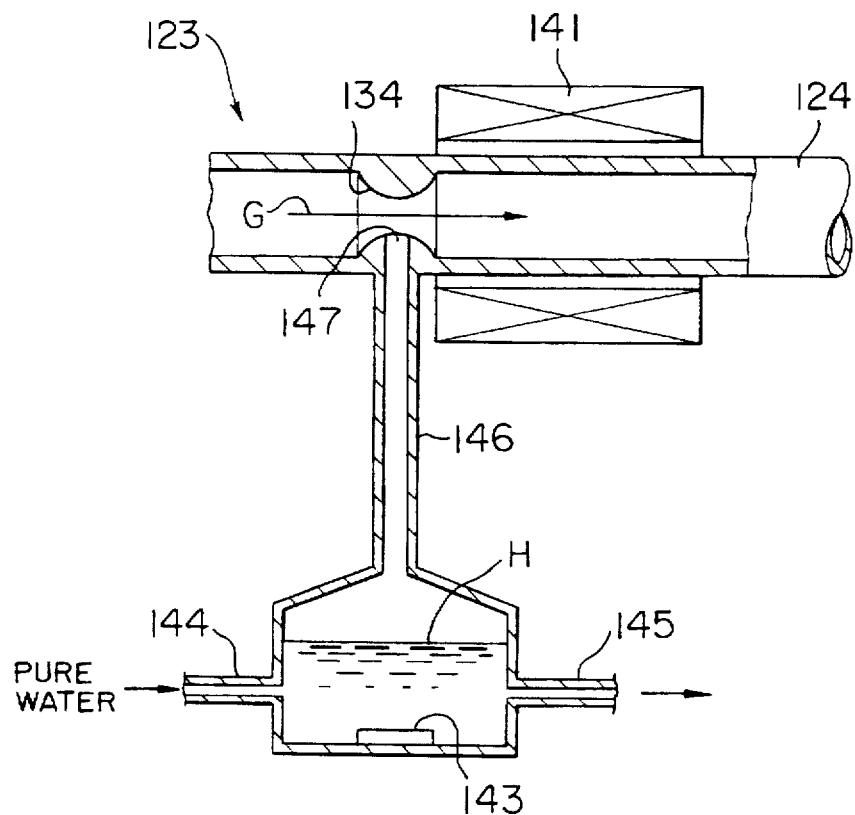
FIG. 8 is an enlarged vertical sectional view of a variation of the atomization means of FIG. 7.

FIG. 8 shows a modification of the atomization means. The atomization means 123 used in the second embodiment mainly comprises a quartz vessel 142 holding pure water H, and an ultrasonic oscillation means 143 provided on the bottom of the vessel 142 for atomizing the pure water H by ultrasonic oscillation. The vessel 142 is connected to a pure water feed pipe 144 and a drain pipe 145 to maintain a purity of the pure water.

A feed pipe 146 is formed on the top of the vessel 143 in one-piece therewith for supplying the atomized pure water into the water vapor supply pipe 124, which has substantially the same structure as that of the first embodiment. A nozzle 147 having a larger bore than that of the pure water feed nozzle 125 of the first embodiment is provided in the throttle 134 provided on an inside of the water vapor supply pipe 124 for injecting the atomized pure water fed through the feed pipe 146. According to the second embodiment, the pure water can be atomized independently of the carrier gas G flowing through the water vapor supply pipe 124, and the atomized pure water is fed into the reaction tube 102, being vaporized into water vapor by the heated carrier gas G. A feed amount of the water vapor can be controlled by the ultrasonic oscillation means 143.

The present invention is not limited to the above-described embodiment and cover modifications and variations within the scope of the present invention. For example, in the second embodiment, after the interior of the reaction tube 102 is replaced by nitrogen gas and further by oxygen gas, oxidation is started. But the replacement with nitrogen gas without replacement by oxygen gas is followed directly by oxidation. In this case, nitrogen gas is fed as the carrier gas G from the nitrogen gas source 132, and the oxygen gas source 130 is not necessary.

An inert gas as the carrier gas G, in addition to nitrogen gas, e.g., argon gas, helium gas, etc. can be used.

The first and the second heaters are provided in the water vapor feed pipe, but either of both heaters can be omitted if the atomized pure water can be perfectly atomized by one of the heaters.

[Third Embodiment]

The third embodiment of the present invention will be explained with reference to the attached drawings hereto.

Figure 9:
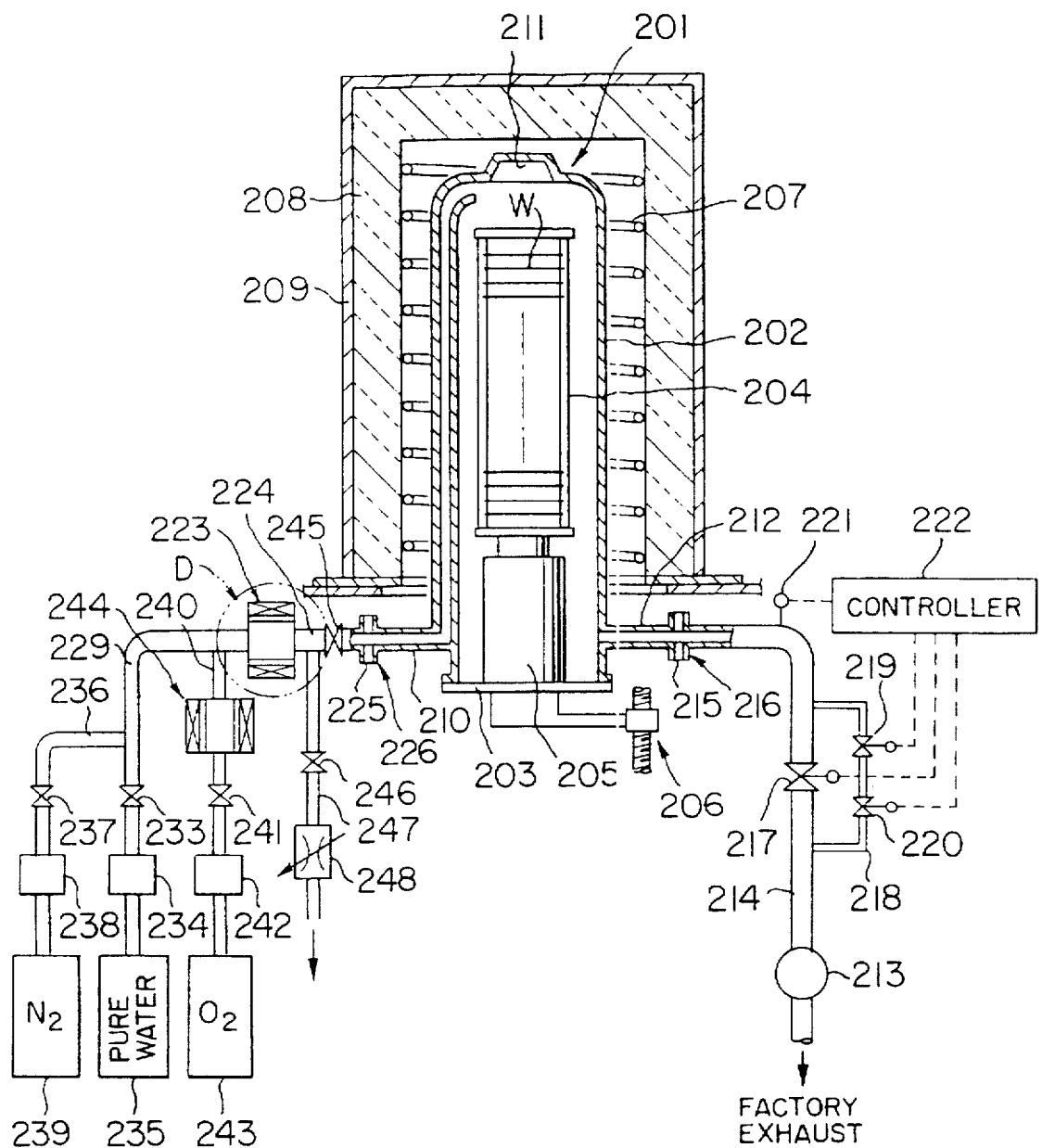
FIG. 9 is a vertical sectional view of the oxidation system according to a third embodiment of the present invention.

In FIG. 9 showing the general structure of the oxidation system according to the third embodiment of the present invention, as in the above-described embodiments, reference numeral 701 represents a vertical processing furnace for oxidizing objects to be processed, semiconductor wafers W at a high temperature, e.g., about 850° C. The processing furnace 201 includes a heat resistant reaction tube 202 of, e.g., quartz in the shape of a vertical cylinder having the bottom opened. The reaction tube 202 is closed at the bottom opening by a cap 203 to form a highly air-tight vessel. The cap 203 for closing and opening the bottom opening is disposed below the reaction tube 202. On the cap 203 there is provided a wafer boat 204 through a heat insulating cylinder 205. The wafer boat 204 holds a number of semiconductor wafers W horizontally supported and vertically spaced from each other.

The cap 203 is connected to a lift mechanism 206 which loads and unloads the wafer boat 204 into and out of the reaction tube 202 while moving the cap 203 up and down to open and close the bottom opening. A heater 207 is provided around the reaction tube 202, and heats the interior of the reaction tube 202 up to a required temperature, e.g., 800°–1000° C. An outer shelter of stainless steel 209 is provided around the outside of the reaction tube 202 through heat insulating material 208.

A water vapor feed pipe 210 is provided in a side of the reaction tube 202 in one-piece with the reaction tube 202, and is integral with a wall of the reaction tube 202 at a proximal part thereof and is extended upward is integral with a tubular wall of the reaction tube 202 to be opened in a water vapor feed port 211 formed in a concavity on the upper end of the inside of the reaction tube 202. An exhaust pipe 212 is provided in a different side of the reaction tube 202 and is air-tightly connected to a pressure reduction pipe 214 having a pressure reduction pump 213 as pressure reduction means by flange couplings 216 with a double O-ring 215 therebetween.

An opening/closing valve 217 in the form of, e.g., an angle valve is inserted in the pressure reduction pipe 214, and a bypass pipe 218 is connected to the pressure reduction pipe 214. An opening/closing valve 219 in the form of, e.g., an air operate valve, and a pressure control valve 220 in the form of, e.g., piezo-valve are inserted in the bypass pipe 218. When the interior of the reaction tube 202 is evacuated to about 300–500 Torr, the controller 222 controls various instruments in accordance with pressures detected by the pressure sensor 221 to open the opening/closing valve 217 of the pressure reduction pipe 214 so as to reduce a pressure down to a required pressure, and then close the opening/closing valve 217 of the pressure reduction pipe 214 while opening the opening/closing valve 219 of the bypass pipe 218 so as to maintain the required pressure by the pressure control valve 222. The downstream of the pressure reduction pipe 214 is connected to a factory exhaust duct not shown.

Figure 10:
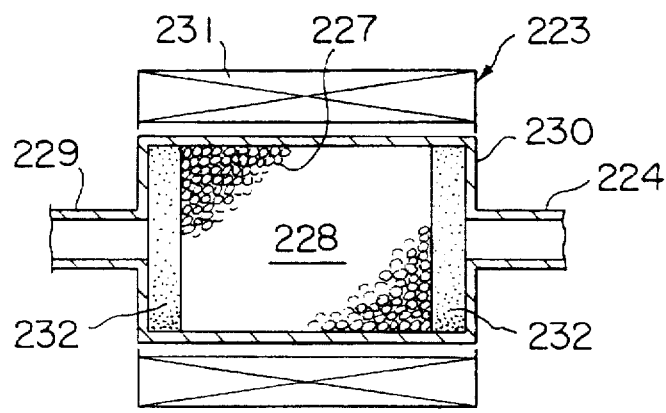
FIG. 10 is an enlarged sectional view of the boiling water vapor generating unit (indicated by the arrow D) of the oxidation system of FIG. 9.

To supply water vapor into the reaction tube 202 of the processing furnace 201, the third embodiment includes a boiling water vapor generating unit 223 (indicated by the arrow D in FIG. 9) for boiling pure water and generating water vapor, and a water vapor supply pipe 224 for feeding to the reaction tube 202 the water vapor generated by the boiling water vapor generating unit 223. The water vapor supply pipe 224 is connected air-tight to the water vapor feed pipe 210 by flange couplings 226 with a double O-ring 225 therebetween. As shown in FIG. 10, the boiling water vapor generating unit 223 comprises a cylindrical filter 228 of sintered heat-resistant particles 227, such as silicon carbide (SiC), a cylindrical heat resistant casing 230 housing the filter 228 and having one end connected to a pure water feed pipe 229 for introducing pure water and the other end connected to the water vapor supply pipe 224, and a heating means 231 provided around the casing 230 for heating to boil the pure water through the filter 228.

The casing 230 is formed of stainless steel surface-treated for prevention of, e.g., metal contamination, and the pure water feed pipe 229 and the water vapor supply pipe 234 are formed of, e.g., stainless steel. Sub-filters 232 in the form of, e.g., ceramic filters are provided on both ends of the casing 230 for the prevention of flowing outside of released particles 227 from the filter 228. The heating means 231 is provided by, e.g., a cylindrical electric heater and heats the casing 230 up to, e.g., about 200° C.

As shown in FIG. 9, the pure water feed pipe 229 is connected to a pure water source 235 for feeding pure water through an opening/closing valve 233 and a flow rate control mechanism 234. A pipe branched from the pure water feed pipe 229 downstream of and near the opening/closing valve 233 is connected to a nitrogen gas source 239 through an opening/closing valve 237 and a flow rate control mechanism 238. A pipe 240 branched from the pure water feed pipe 229 upstream of and near the boiling water vapor generating unit 223, which is connected to an oxygen gas source 243 for feeding oxygen gas as a carrier gas through an opening/closing valve 241 and a flow rate control mechanism 242.

A gas heating unit 244 for heating oxygen gas up to a required temperature, e.g., about 200° C. is inserted in the pipe 240 for feeding oxygen gas. Substantially similarly with the boiling water vapor generating unit 223, the gas heating unit 244 comprises the casing 230 housing the filter 228 and the sub-filters 232, and heating means 231 provided around the casing 230 (see FIG. 10). An opening/closing valve 245 is inserted in the water vapor supply pipe 224,and a drain pipe 247 is branched from the water vapor supply pipe 224 upstream of and near the opening/closing valve 245, so that surplus water vapor, etc. are discharged through an orifice varying valve 248 for pressure control when oxidation is over, and the interior of the casing 230 of the boiling water vapor generating unit can be replaced by nitrogen gas.

The, the operation of the oxidation system according to the third embodiment is explained. As shown in FIG. 9, nitrogen gas is fed into the reaction tube 202 of the processing furnace 201 from the nitrogen gas source 239 through the water vapor supply pipe 224 with the opening/closing valves 217, 237, 245 opened, and the opening/closing valves 219, 233, 241, 246 closed while the interior of the reaction tube 202 is evacuated by the pressure reduction pipe 214 and the pressure reduction pump 213, whereby the interior of the reaction tube 202 is replaced by the nitrogen gas. Then the cap 203 is opened, and the wafer boat 203 holding semiconductor wafers W is loaded into the reaction tube 202 together with the heat insulating cylinder 205. Then with the nitrogen gas fed, the controller 222 controls to reduce an internal pressure down to, e.g., 400 Torr, and then with this pressure retained, the closing/opening valve 237 is closed, the opening/closing valves 233, 241 being opened to feed water vapor into the reaction tube 202. It is also possible that the nitrogen gas source 239 is switched to the oxygen gas source 243, the interior of the reaction tube 202 is replaced by oxygen gas, and the water vapor is fed into the reaction tube 202.

Opening of the opening/closing valves 233, 241 admit the pure water from the pure water source 235 into the casing 230 of the boiling water vapor generator 223 of FIG. 10 through the flow rate control mechanism 234 and the pure water feed pipe 229 while oxygen gas is fed from the oxygen gas source 243 together with the pure water through the flow rate control mechanism 242 and the gas heating means 244. The pure water fed into the casing 230 together with the oxygen gas is heated and boiled into water vapor while passing through the heated filter 228 having a large surface area. The thus-generated water vapor is fed into the reaction tube 202 together with the hydrogen gas, a carrier gas through the water vapor supply pipe 224 and the water vapor feed pipe 210 to contribute to oxidation of the semiconductor wafers W. The oxygen gas, the carrier gas also contributes to the oxidation. A feed amount of the water vapor for the reaction tube 202 is controlled by the flow rate control mechanisms 234, 242 for the pure water source 235 and the hydrogen gas source 243.

Thus in the third embodiment, the interior of the reaction tube 202 for oxidizing semiconductor wafers W at a high temperature is evacuated, and water vapor generated by the boiling water vapor generating unit 223 is fed into the reaction tube having a high temperature and a reduced internal pressure through the water vapor supply pipe 224. This makes it possible to wet oxidize semiconductor wafers W under a reduced pressure without use of a burning apparatus. Water vapor is not generated by burning hydrogen gas and oxygen gas under a reduced pressure, but is generated by the boiling water vapor generating unit 223. As result, water vapor can be stably supplied into the reaction tube 202, film quality of the oxide films can be improved, and safety can be improved. As shown in FIG. 10, pure water is heated and boiled through the filter 228 of sintered heat resistant particles 227 with a large surface area. This makes it possible to supply water vapor effectively and stably by the simple structure, and equipment cost reduction can be made.

When the oxidation is thus finished, as shown in FIG. 9, the opening/closing valves 233, 241, 245 are closed with the opening/closing valves 237, 246 opened to discharge residual pure water and water vapor in the casing 230 of the boiling water vapor generating unit 223 and the water vapor supply pipe 224 is discharged through the drain pipe 247, and the interiors of the casing 230 and the water vapor supply pipe 224 are replaced by nitrogen gas. Then with the opening/closing valve 246 closed and the opening/closing valve 245 opened, the interior of the reaction tube 202 is replaced by nitrogen gas, and then the pressure reduction pump 213 is stopped to return the interior of the reaction tube 202 to the normal pressure. Then the processed semiconductor wafers are unloaded on the wafer boat 204 downward out of the reaction tube 202 together with the heat insulating cylinder 205 by the lift mechanism 206.

Figure 11:
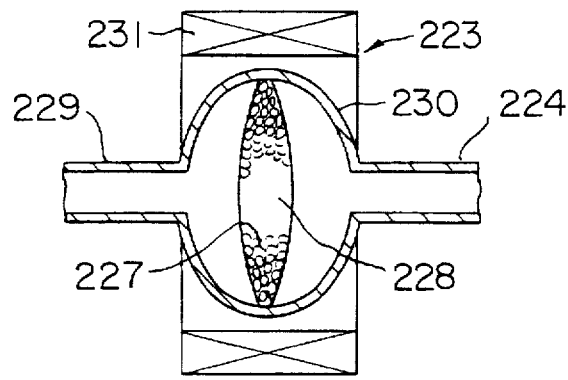
FIG. 11 is an enlarged vertical sectional view of a variation of the boiling water vapor generating unit of FIG. 10.

FIG. 11 shows a variation of the boiling water vapor generating unit used in the third embodiment of the present invention. In the third embodiment, the boiling water vapor generating unit 223 includes a spherical casing 230 having one end connected to the pure water feed pipe 229 and the other end connected to the water vapor supply pipe 224, a lens-shaped filter 228 provided in the casing 230, and heating means 231 provided around the casing 230. The filter 228 is the so-called metal filter of sintered metal. This boiling water vapor unit 223 produces the same effects as the above-described embodiment.

Figure 12:
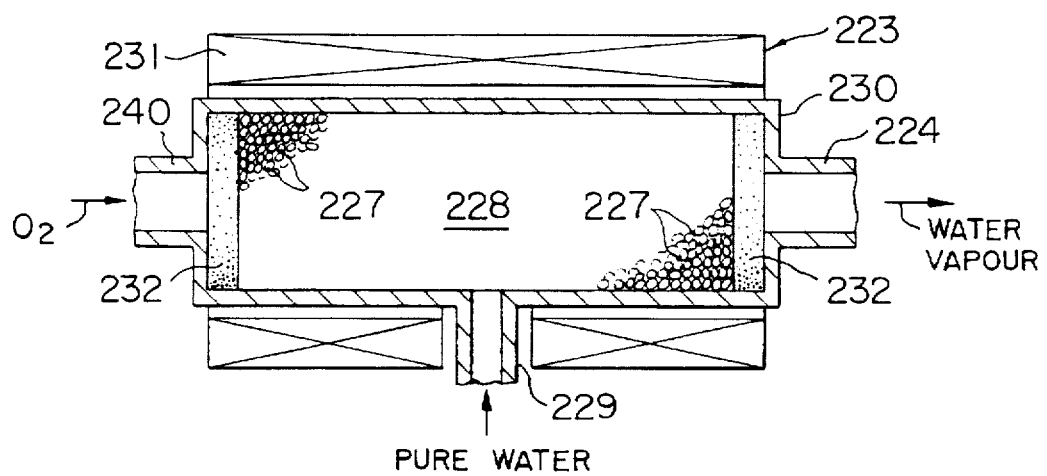
FIG. 12 is an enlarged vertical sectional view of another variation of the boiling water vapor generating unit of FIG. 10.

FIG. 12 shows another variation of the boiling water vapor generating unit. The water vapor generating means 223 according to this variation includes, as does the boiling water vapor unit 223, a cylindrical heat resistant casing 230 housing a cylindrical filter 228 and a pair of sub-filters 232, and heating unit 231 provided around the casing 230. One end of the casing 230 is not connected to the pure water feed pipe 229 but connected to the pipe 240 for feeding oxygen gas, and the other end of the casing 230 is connected to the water vapor supply pipe 224. The pure water feed pipe 229 is connected to the intermediate part of the casing 230.

According to this variation, in the casing 230 the oxygen gas fed through the pipe 240 for supplying oxygen connected to one end of the casing 230 is heated and boiled by the pure water fed through the pure water feed pipe 229 provided at the intermediate part, and water vapor generated by the boiling is fed into the reaction tube 202 together with the oxygen gas through the water vapor supply pipe 224. Because the oxygen gas is thus heated in the casing 230, the gas heating means 244 provided in the pipe 240 for feeding oxygen gas in FIG. 9 is not necessary. The structure can be simplified, and equipment costs can be reduced.

[Fourth Embodiment]

The oxidation system according to a fourth embodiment of the present invention, and one embodiment of the oxidation method according to the present invention is explained with reference to drawings attached hereto.

Figure 13:
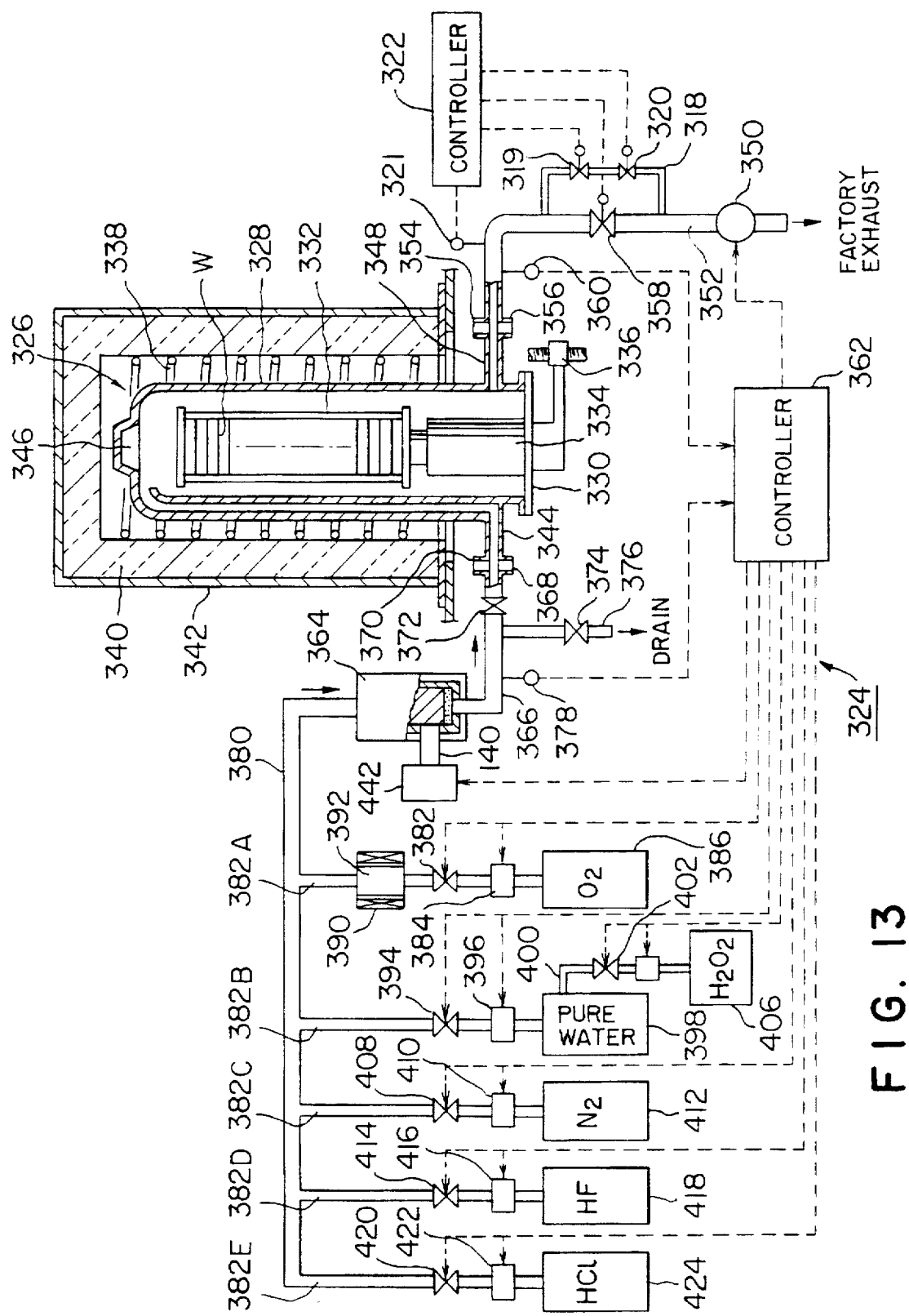
FIG. 13 is a vertical sectional view of the oxidation (heat treatment) system according to a fourth embodiment of the present invention.
Figure 16:
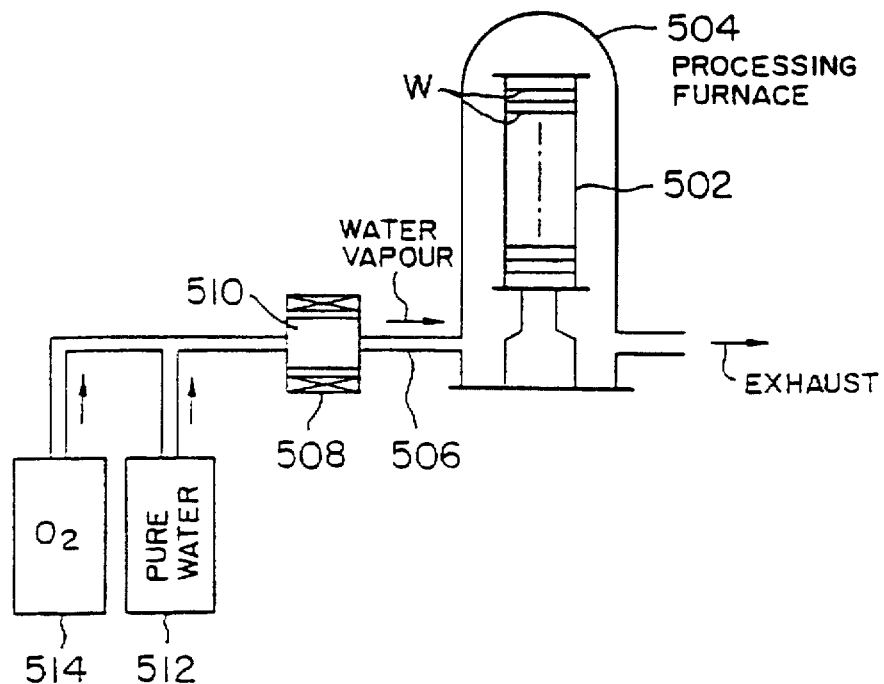
FIG. 16 is a block diagram of a conventional water vapor generating apparatus for burning hydrogen gas and an oxidation gas to generate water vapor.

In FIG. 13, the oxidation system according to the fourth embodiment of the present invention includes a vertical processing furnace 326 for oxidizing objects to be processed, e.g., semiconductor wafers W at a high temperature, e.g., about 850° C. The processing furnace 326 includes a heat resistant reaction tube 328 of, e.g., quartz in the shape of a vertical cylinder having the bottom opened. The reaction tube 328 is closed at the bottom opening by a cap 330 to form a highly air-tight vessel. The cap 330 for closing and opening the bottom opening is disposed below the reaction tube 328. On the cap 330 there is provided a wafer boat 332 through a heat insulating cylinder 334. The wafer boat 332 that holds a number of semiconductor wafers W horizontally supported and vertically spaced from each other.

The cap 330 is connected to a lift mechanism 336 which loads and unloads the wafer boat 332 into and out of the reaction tube 328 while moving the cap 330 up and down to open and close the bottom opening. A heater 338 is provided around the reaction tube 328, and heats the interior of the reaction tube 328 up to a required temperature, e.g., 800°–1000° C. An outer shell 342 is provided around the outside of the reaction tube 328 through a heat insulating material 340.

A water vapor feed pipe 344 is provided in a lower part of a side of the reaction tube 328 in one-piece therewith, and is integral with a wall of the reaction tube 328 at a proximal part thereof and is extended upward and is integral with a tubular wall of the reaction tube 328 to be opened in a water vapor feed port 346 formed in a concavity on the upper end of the inside of the reaction tube 328. An exhaust pipe 348 is provided in a different lower part of a side of the reaction tube 328 and is air-tightly connected to a pressure reduction pipe 352 with a pressure reduction pump 350 having, e.g., a turbo-molecular pump as pressure reduction means by flange couplings 356 with a double O-ring 354 therebetween.

A opening/closing valve, 358, e.g., an angle valve is inserted in the pressure reduction pipe 352. The opening/closing valve 358 and the pressure reduction pump 350 are controlled by a control unit 362, e.g., microcomputer or others, in response to pressures detected by a exit pressure sensor 360 disposed in the pressure reduction pipe 352, so that the interior of the reaction tube 358 is evacuated and maintained under about 300–500 Torr. The downstream end of the pressure reduction pipe 352 is connected to a factory exhaust duct not shown.

The opening/closing valve 358 is bypassed by a bypass pipe 318, and an opening/closing valve 319, e.g., an air operate valve, and a pressure control valve 320, e.g., piezovalve, are inserted in the bypass pipe 318. When the interior of the reaction tube 328 is evacuated to a required pressure, e.g., 300–500 Torr, the controller 322 controls instruments to first open the opening/closing valve 358 to the pressure reduction pipe 352 in response of a pressure detected by the pressure sensor 321 to reduce the interior of the reaction tube 328 near the required pressure, and next close the opening/closing valve 358 of the pressure reduction pipe 352, opening the opening/closing valve 319 of the bypass pipe 318, whereby to maintain the required pressure by the pressure control valve 320.

To supply water vapor to the reaction tube 328 of the processing furnace 326, as will be described later, microwave water vapor generating unit 364 is provided to heat and boil pure water by microwaves. The water vapor generating unit is connected to one end of a water vapor supply pipe 366 of, e.g. quartz. The other end of the water vapor supply pipe 366 is connected air-tight to a water vapor feed pipe 344 by flange couplings 370 with a double O-ring 368 therebetween.

An opening/closing valve 372 is inserted in the water vapor supply pipe 366, and a surplus water vapor drain pipe 376 with an opening/closing valve 374 inserted therein is branched from the water vapor supply pipe 366 upstream of the opening/closing valve 372. Upstream of the junction there is provided an entrance pressure sensor 378. As will be described later, the control unit 362 controls the amount water vapor generation, based on detected values from the entrance pressure sensor 378 and the exit pressure sensor 360.

The water vapor generating unit 364 is connected to a pure water feed pipe 380 of, e.g., quartz, for supply of pure water. A plurality of branch pipes 382A–382E are branched from the pure water feed pipe 380. A first branch pipe 382A is connected to an oxygen gas source 386 which supplies oxygen gas as a carrier gas through an opening/closing valve 382 and a flow rate control mechanism 384 for control of flow rates, e.g., a microcontroller. Gas heating means 392 having a heater 390 is inserted in the branch pipe 382A downstream of the opening/closing valve 382 to heat the oxygen gas flowing therethrough to, e.g., about 200° C.

A second branch pipe 382B is connected to a pure water source 398 which supplies pure water through an opening/closing valve 394 and a microcontroller 396. A pure water tank of the pure water source 398 is connected to a pipe 400. The pipe 400 is connected to a hydrogen peroxide source 406 for reserving hydrogen peroxide for suppressing propagation of microorganisms to supply the hydrogen peroxide as required to the pure water source 398.

A third branch pipe 382C is connected to a nitrogen gas source 412 for supply of nitrogen gas as an inert purge gas through an opening/closing valve 408 and a microcontroller 410.

A fourth branch pipe 382D is connected to a hydrogen fluoride source 418 for supply of hydrogen fluoride through an opening/closing valve 414 and a microcontroller 416 for killing microorganisms, e.g., bacteria, virus, etc. on the inside walls, etc. of the microwave water vapor generating unit 364, the reaction tube 328, the pipes interconnecting these members, which are located downstream of the opening/closing valve 414 and the microcontroller 416.

A fifth branch pipe 382E is connected to a hydrogen chloride source 424 for supply of hydrogen chloride as a trap gas which traps metal atoms dispersed in the reaction tube 328, from the heater 338, etc.

The microwave water vapor generating unit 364 characterizing the fourth embodiment of the present invention includes, as shown in FIG. 14, a vertically cylindrical water vapor generating casing 426 of, e.g., quartz, and a pure water supply nozzle 428 provided in the ceiling thereof and connected to the pure water feed pipe 380. Water vapor discharge port 430 is formed in the bottom of the water vapor generating casing 426 for discharging generated water vapor. The water vapor discharge port 430 is not necessarily formed in the bottom and may be formed in a lower side, an upper side or other locations. The water vapor generating casing 426 houses a cylindrical filter 434 of sintered heat-resistant particles, as of silicon carbide (SiC). Sub-filters 436 are provided on the upper and the lower ends of the filter 434 for preventing particles 432 released from the filter 434 from flowing out of the casing.

A microwave introduction port 438 is formed in a side of the water vapor generating casing 426. The microwave introduction port 438 is connected to a microwave generator 442 for generating microwaves through a metal waveguide 440, so that the pure water in the water vapor generating casing 426 is heated and boiled into microwaves by the microwaves. The waveguide 440 may be any as long as it can effectively propagate generated microwaves, and can be, e.g., a rectangular sectional rectangular waveguide, a circular sectional round waveguide or others.

A frequency range of the usable microwaves is 1000–35000 MHz, preferably 910 MHz or 2450 MHz. The microwave generator 442 is generally a microwave electron tube. The electron tube is a space charge control tube, such as a disk-seal tube or an electron transit time tube, such as a klystron, traveling-wave tube, magnetron, and backward wave guide, preferably a magnetron, which can effectively provide high outputs and has stable operations. A microwave shielding material 444 of a metal mesh or a metal sheet is provided around the entire circumference of the water vapor generating casing 426 and the waveguide 440 in close contact therewith so that harmful microwaves do not leak outside. Then, the oxidation method using the fourth embodiment of the above-described structure is explained as follows.

Just after the oxidation system 324 of FIG. 13 is fabricated or opened for maintenance of the processing furnace 326, etc., microorganisms, such as bacteria, etc. in the atmosphere (cleanroom) stay on the inside of the pipes and reaction tube 328. Oxidation in this state sometimes causes wafer defects due to the microorganisms.

In the oxidation method for the fourth embodiment, the oxidation process follows sterilization for killing the microorganisms. First, with the reaction tube 328 loaded with no semiconductor wafers W, hydrofluoride (HF) is sent out from the hydrofluoride source 418 to be introduced into the reaction tube 328 through the pure water feed pipe 380, the microwave water vapor generating unit 364 and the water vapor supply pipe 366, and is kept in the reaction tube 328 for a required period of time. In this state, the opening/closing valve 358 is closed. The hydrofluoride may be fed in hydrofluoride solution or hydrofluoride gas. In the case that the hydrofluoride is fed in hydrofluoride solution, its HF concentration is set preferably within a range of, e.g., 1–100 PPM and is filled fully in the reaction tube 328 and left for some hours, e.g., 3 hours for sterilization. Thus not only can the interior of the reaction tube 328, be sterilized but also the interiors of the water vapor generating unit 364, and the interiors of the pipes through which the hydrogen chloride solution flows.

When the sterilization is over, the hydrogen fluoride in the system is discharged out of the system through the pressure reduction pipe 352. In this case, extra cleaning water is flowed through the system to remove residual hydrogen fluoride in the system. For effective use of the cleaning water, discharged cleaning water may be recirculated through the reaction tube 328. In this case, an ion exchange resin is provided in the recirculation passage to remove the hydrogen fluoride in the cleaning water.

After the hydrogen fluoride has been removed, then oxidation process follows. With the opening/closing valve 408 opened, nitrogen gas is supplied into the reaction tube from the nitrogen gas source 412 through the pure water feed pipe 380 and the water vapor supply pipe 366 while the atmosphere in the reaction tube 328 is evacuated by the pressure reduction pump 350 through the pressure reduction pipe 328 to replace the interior of the reaction tube 352 with the nitrogen gas.

Then, the cap 330 is opened, and the wafer boat 332 holding a number of semiconductor wafers W, along with the heat insulating cylinder 334 is loaded into the reaction tube 328 to make the interior of the reaction tube 328 air-tight. The heater 338 has been actuated to retain the loaded wafers W at a processing temperature, e.g., 850° C. with the nitrogen gas being fed. With the nitrogen gas being fed, the control unit 362 controls feed amounts and exhaust amounts of the hydrogen gas, whereby the interior of the reaction tube 328 is evacuated to a required processing pressure, e.g., 400 Torr. With this pressure maintained, water vapor generated by the water vapor generating unit 364 is fed into the reaction tube 328, and oxidation of the surfaces of the wafers is started. To generate water vapor, pure water is introduced into the water vapor generating unit 364 from the pure water reservoir 398 with flow rates thereof being controlled by the microcontroller 396 while oxygen gas as a carrier gas is fed into the water vapor generating unit 364 from the oxygen gas source 386.

The pure water fed into the water vapor generating unit 364 is dropped into the water vapor generation casing 426 of FIG. 14 and is boiled and vaporized by energy of the microwaves propagating from the microwave generator 442 through the waveguide 440. The water vapor generated there is supplied, as described above, into the reaction tube 328 through the water vapor supply pipe 366 connected to the bottom of the water vapor generation casing 426.

A feed amount of the water vapor is determined, e.g., by a difference between a detected value from the exit pressure sensor 360 in the pressure reduction pipe 352 and that from the entrance pressure sensor 378 in the water vapor supply pipe 376, and is controlled by increasing or decreasing a feed amount of the pure water, and an output of the microwave generator 442. Generally, when a processing pressure is, e.g. 400 Torr, a water vapor mount is set so that a detected value of the entrance pressure sensor 378 is, e.g., about 405 Torr. Output control of the magnetron as the microwave generator 442 can be easily conducted by invertor control and is quicker in comparison with that of the conventional water vapor generation systems by burning and heaters.

Thus in the fourth embodiment, the interior of the reaction tube 328, which processes semiconductor wafers W at a high temperature, is evacuated, and water vapor generated by microwave energy is fed into the reaction tube 328 at the high temperature and under a reduced pressure, whereby the semiconductor wafers W can be wet oxidized without the use of heating means, such as a burning apparatus and heater. As a result, film quality of the oxide films can be improved. Because of the filter 434 of sintered heat-resistant particles 432 having a large surface area, water vapor can be effectively, stably supplied by the simple structure.

The pure water in the pure water reservoir 398 contains hydrogen peroxide fed from the hydrogen peroxide reservoir 406 connected to the pure water reservoir 398, whereby propagation of bacteria possibly living in the pure water of the pure water reservoir 398 can be suppressed. Thus, together with the sterilization before the start of an oxidation process, substantially no microorganisms, such as bacteria, etc. do not intrude into the reaction tube 328, so that wafer surface defects due to microorganisms can be drastically suppressed. In this case, preferably a concentration of the hydrogen peroxide in the pure water is sufficient to suppress propagation of at least bacteria, e.g., above 1 weight percent.

During the oxidation processing, a set amount of hydrogen chloride gas as a trap gas is supplied into the reaction tube 328 from the hydrogen chloride reservoir 424 to trap metal atoms passing through the reaction tube wall from, e.g., the heater 338, etc. Hydrogen chloride gas is a corrosive gas, but no trouble is caused because all the pipes that the hydrogen chloride gas passes through are formed of quartz, which is highly corrosion resistant.

More preferably a heat tape (not shown) is wound on the water vapor supply pipe 366 to heat the same, whereby the dewing of the water vapor flowing through the water vapor supply pipe 366 can be prevented.

When the oxidation of the semiconductor wafers W is thus over, supply of the pure water, oxygen gas, etc. is stopped, and residual water vapor and pure water in the water vapor generating casing 364 are discharged out of the system through the surplus water vapor discharge pipe 376. Then the interior of the reaction tube 328 is again replaced by nitrogen gas and then is returned to the normal pressure. And the processed semiconductor wafers W are unloaded downward out of the reaction tube 328.

The filter 434 provided in the water vapor generating casing 364 is not essentially limited to a ceramic filter and may be, e.g., the so-called metal filter of sintered metal.

The water vapor generating unit 364 is not essentially cylindrical and vertical, and may be horizontal as exemplified in FIG. 15. That is, in the horizontal microwave water vapor generating unit 364, similarly with the water vapor generating unit 364 of FIG. 14, the water vapor generating casing 426 houses a cylindrical filter 434, and sub-filters 432 disposed on both end thereof. The microwave generator 442 is connected to a side of the casing through the waveguide 440. The pipe 382A for supply of oxygen gas in place of the pure water feed pipe is connected to one end of the casing 426, and the water vapor supply pipe 366 is connected to the other end thereof. The pure water feed pipe 380 is connected to a longitudinal part of the casing 426. This arrangement can also produce the same effects as described above.

What is claimed is:

1. A reduced pressure and wet oxidation system comprising:

a processing furnace for oxidizing object to be processed at a high temperature and under reduced pressure;

pressure reducing means for evacuating the interior of the processing furnace and reducing a pressure therein;

burning means disposed outside the processing furnace for burning hydrogen gas and oxygen gas to generate water vapor;

water vapor supply means interconnecting the burning means and the processing furnace operating at a reduced pressure; and throttle means disposed on the water vapor supply means for generating a pressure difference in the water vapor supply means between a side of the burning means and a side of the processing furnace so that the pressure in the burning means is higher than the pressure in the processing furnace.

2. The oxidation system according to claim 1, wherein the throttle means is provided in multi-stages along the water vapor supply means.

3. The oxidation system according to claim 1, wherein the throttle means is formed in a forwardly divergent nozzle.

4. The oxidation system according to claim 1, wherein the heating means is provided around the water vapor supply means for heating water vapor which has just passed through the throttle means.

5. A wet oxidation method utilizing the system defined in claim 1 comprising the steps of:

reacting hydrogen gas and an oxygen gas with each other to generate water vapor in said burning means;

feeding the water vapor through said water vapor supply means and into said evacuated processing furnace without further reducing the pressure in said processing furnace so that the pressure reduction does not directly affect the reaction; and generating a pressure differential in said water vapor supply means.

6. A wet oxidation method comprising the steps of:

reacting hydrogen gas and an oxygen gas with each other to generate water vapor;

feeding the water vapor into an evacuated processing furnace without further reducing the pressure in said processing furnace so that the pressure reduction does not directly affect the reaction; and loading objects to be processed into the evacuated processing furnace, and heating the objects to be processed in contact with the fed water vapor for oxidation.

7. An oxidation system comprising:

a processing furnace for oxidizing objects to be processed;

said processing furnace having a reaction tube;

said reaction tube having an interior and an exterior wall;

a water vapor feed pipe connected to said reaction tube;

said water vapor feed pipe having a first and a second end;

said first end of said water vapor feed pipe extending into the interior of said reaction tube forming a tubular wall;

said tubular wall having an opening in the interior of said reaction tube;

said opening forming a water vapor feed port;

a water vapor supply pipe connected to said water vapor feed pipe;

an exhaust pipe positioned on said reaction tube;

said heat reaction tube having an opening disposed about said bottom of reaction tube;

a cap inserted in said opening;

a heat insulating cylinder mounted on said cap;

an upright wafer boat having a plurality of slots mounted on said heat insulating cylinder;

a lift mechanism connectedly coupled to said cap for loading and unloading said wafer boat into and out of said reaction tube;

a heater surrounding the exterior of said reaction tube for heating the interior of said reaction tube;

a heat insulating material surrounding said heater;

an outer shelter surrounding said heat insulating material;

pressure reducing means for evacuating the interior of the processing furnace;

burning means disposed outside the processing furnace for burning hydrogen gas and oxygen gas to generate water vapor;

water vapor supply means interconnecting the burning means and the processing furnace; and throttle means disposed on the water vapor supply means for generating a pressure difference in the water vapor supply means between a side of the burning means and a side of the processing furnace.

8. The oxidation system according to claim 7, wherein said water vapor supply means and said throttle means further comprises:

a water vapor heater coupled to said water vapor supply pipe;

a restricted part of said water vapor supply pipe generating a pressure difference between said processing furnace and said burning means; and said burning means for burning hydrogen and oxygen gas connected to said water vapor feed pipe proximate said restricted part.

9. The oxidation system according to claim 8, wherein said burning means further comprises:

a burning vessel for burning hydrogen and oxygen gas having a top portion and a bottom portion;

said top of said burning vessel connected to said water vapor supply pipe and proximate said water vapor heater;

a concavity forming said bottom of said burning vessel;

a partition wall which is a quartz annular diffusion plate connected to said concavity;

a gas feed pipe connected to said bottom of said burning vessel;

said gas feed pipe comprising a hydrogen gas feed pipe and an oxygen gas feed pipe;

said oxygen gas feed pipe having a first and second end, said first end of said oxygen gas feed pipe proximate said bottom of said burning vessel and said diffusion plate;

said diffusion plate having a plurality of oxygen injection nozzles for injecting oxygen gas into the burning vessel;

a gas heater surrounding said gas feed pipe for heating gas injected into said burning vessel to form water vapor;

a heat insulating material provided between said gas heater and said bottom of burning vessel;

a cooling mechanism surrounding said heat insulating material for cooling said heat insulating material;

an oxygen gas source means connected to said oxygen gas feed pipe;

a hydrogen gas source means connected to said hydrogen gas feed pipe; and a nitrogen gas source means connected to said nitrogen gas feed pipe.

10. The oxidation system according to claim 9, wherein said pressure reducing means further comprises:

a pressure reduction pipe engaged with said exhaust pipe forming an air-tight connection;

said pressure reduction pipe inserted in a first valve;

a bypass pipe having a first and second end connected to said pressure reduction pipe, said first valve positioned between said first and second end;

a pressure control valve and a second valve inserted in said bypass pipe;

a pressure reduction pump mounted on said pressure reduction pipe;

a controller having a pressure sensor coupled to said first valve for detecting pressures in said pressure reduction pipe; and said pressure sensor opening or closing said first or said second valve to maintain a required pressure on said pressure control valve.

11. The oxidation system according to claim 8, wherein:

said restricted part has a plurality of quartz orifices equally spaced on multistages integrally connected to said water vapor supply pipe; and said water vapor heater surrounds said water vapor supply pipe and said orifices.

12. The oxidation system according to claim 8, wherein:

said restricted part has a divergent nozzle formed within said water vapor supply pipe; and said water vapor heater surrounds said water vapor supply pipe and said divergent nozzle.

* * * * *

UNITED STATES PATENT AND TRADEMARK OFFICE
CERTIFICATE OF CORRECTION

PATENT NO.   : 5,777,300
DATED        : July 7, 1998
INVENTOR(S)  : HOMMA, et al.

It is certified that error appears in the above-indentified patent and that said Letters Patent is hereby corrected as shown below:

ON THE TITLE PAGE
Item [73]:
Please change the following assignee from:

"Tokyo Electron Tohoku Kabushiki Kaisha, Iwate-ken, Japan"

To:

--Tokyo Electron Limited, Tokyo Japan--

Signed and Sealed this

Twenty-third Day of March, 1999

Attest:

Q. TODD DICKINSON

Attesting Officer    Acting Commissioner of Patents and Trademarks